United States Patent [19]

Ikeuchi

[11] Patent Number: 5,708,673
[45] Date of Patent: Jan. 13, 1998

[54] OPTICAL SIGNAL TRANSMITTER

[75] Inventor: Tadashi Ikeuchi, Kawasaki, Japan

[73] Assignee: Fujitsu Limited, Kawasaki, Japan

[21] Appl. No.: 636,153

[22] Filed: Apr. 22, 1996

[30] Foreign Application Priority Data

Jul. 18, 1995 [JP] Japan ................................ 7-181157

[51] Int. Cl.$^6$ ........................................................ H01S 3/00
[52] U.S. Cl. ............................................................. 372/38
[58] Field of Search ................................ 372/25, 30, 38

[56] References Cited

U.S. PATENT DOCUMENTS 5,373,518  12/1994  Uchiyama ................................ 372/38

Primary Examiner—Rodney B. Bovernick
Assistant Examiner—Robert E. Wise
Attorney, Agent, or Firm—Staas & Halsey

[57] ABSTRACT

An optical transmitter may obtain suitable optical output waveform within a wide temperature range from a semiconductor laser diode with an APC free system. The optical transmitter may be composed of a semiconductor laser diode, a driver circuit operatively connected to the semiconductor laser diode for supplying a bias current and a pulse current corresponding to the level of an input signal to the semiconductor laser diode, a bias current controller operatively connected to the driver circuit for controlling the level of the bias current, a pulse current controller operatively connected to the driver circuit for controlling the level of the pulse current, and a duty variable circuit operatively connected to the driver circuit for setting the duty of the input signal to make the duty of an optical output from the semiconductor laser diode more than 100% at an initial adjustment.

20 Claims, 10 Drawing Sheets $T=T_s$ $T=T_1(>T_s)$

A CASE OF SETTING OPTICAL OUTPUT
WAVEFORM TO 100% OF DUTY

A CASE OF SETTING OPTICAL OUTPUT
WAVEFORM MORE THAN 100% DUTY

Electrical waveform

Optical output waveform

There is no duty temperature fulctuation

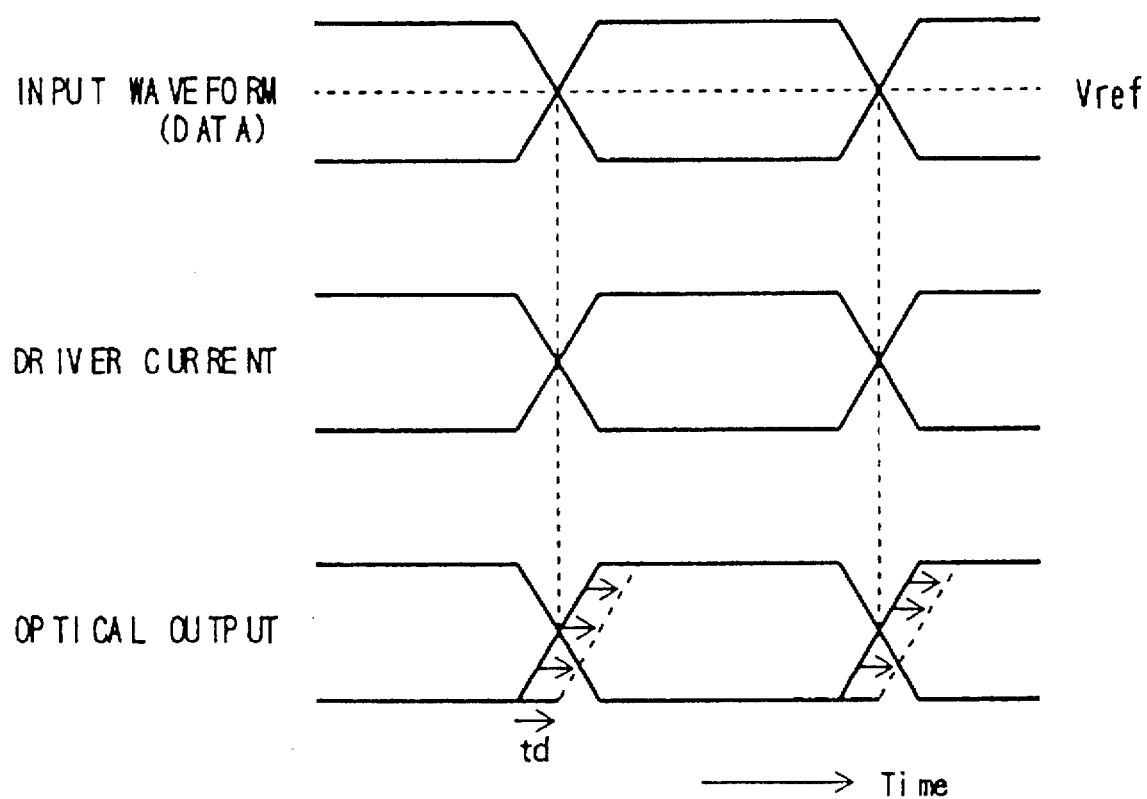

OPTICAL SIGNAL TRANSMITTER

BACKGROUND OF THE INVENTION

1. Field of the Invention

The present invention relates to an optical signal transmitter. More particularly, it relates to an optical signal transmitter having a driver circuit composed of a semiconductor laser diode without including a feed back loop for optical output control.

2. Description of the Related Art

FIG. 12 shows a general optical power and current characteristic of a semiconductor laser diode, which varies with temperature. To generate a constant optical output $P_0$ without depending on the temperature, it is required to control, at least, one of a bias current and a pulse current, according to the temperature fluctuation.

More particularly, in the case where the optical output $P_0$ can be obtained by the bias current $I_B$ and the pulse current $I_P$ on normal temperature. It is required for generating the optical output $P_0$ as the same as that on high temperature, for example, to make the currents $I_B$ and $I_P$ to a bias current $I_B$, and a pulse current $I_P$, respectively.

In a conventional driver circuit for semiconductor laser diode, is provided on each of a bias current supply section and a pulse current supply section not shown in the diagram, a semiconductor element such as a diode having a negative temperature characteristic, which is the characteristic of decreasing a voltage between terminals of the semiconductor element due to the rise of temperature. The driver circuit is constructed to increase a bias current and a pulse current in accordance with decreasing the voltage and to obtain constant output power.

Meanwhile, to obtain a suitable transmission characteristic, optical output waveform having a large optical quenching ratio, i.e., a ratio of optical output of "1" and "0", and an eye opening characteristic (eye pattern) is desired. Therefore, the conventional semiconductor laser driver circuit controls a bias current to be Ib=Ith (Ith means a threshold value for outputting light, when exceeding the value).

In recent years, an optical transmitter and receiver has been demanded for use in a data transmitting system, which transmits optical parallel signals between computers. In an optical transmitter having a semiconductor laser diode (LD), it is general to employ an Automatic Phase Control (APC) system using a feed back loop, which controls an optical output from the semiconductor laser diode to be a constant, based on information obtained by monitoring a part of the optical output.

However, in an optical transmitter and receiver for transmitting the above-described parallel signals, there has been inconvenience to employ the Automatic Phase Control (APC) system, which employs the feed back loop.

A plurality of semiconductor laser diodes should be used to transmit parallel signals. In the APC system, it is required to monitor optical output power of all semiconductor laser diodes. Therefore, a plurality of photo diodes are required to be installed to monitor each of the outputs of the plurality of the semiconductor laser diodes, and then cause problems for mounting spaces.

In an optical output control system, which does not employ the APC system, i.e., an APC free system;

an turn-on delay time $t_d$ of LD, can be calculated with the expression of $$Td = \tau s \ln ((If - Ib)/(If - Ith)) \quad (1)$$

where $\tau s$ is a carrier life time, If is a LD current, and Ib is a bias current. The threshold value (Ith) of a semiconductor laser diode is increased by the expressed turn-on delay time $(T_d)$ of LD, according to the rise of temperature. As shown in FIG. 13, the turn-on delay time $T_d$ of the optical output is generated thereby. Then, the turn-on delay time Td becomes large as the difference between Ith and $I_B$ becomes large. Therefore, optical output waveform in a phase direction is crushed, so that an optical output cannot be stably obtained within a wide temperature range.

Further, even if a duty is controlled based on temperature in the semiconductor laser driver circuit, the duty of the output is changed according to the input waveform. Therefore, it is impossible to obtain stable optical output waveform.

More particularly, it is difficult to install photo diodes system for monitoring, when employing the APC system in an optical parallel transmission. Even if the APC free system is employed, problems occur, such that suitable optical output waveform cannot be obtained within a wide temperature range.

SUMMARY OF THE INVENTION

Accordingly, it is an object of the present invention to provide an optical signal transmitter employing a semiconductor laser modulating system to obtain suitable optical output waveform within a wide temperature range.

Further, it is another object of the present invention to provide an optical signal transmitter employing a semiconductor laser modulating system, in which suitable optical waveform can be obtained within a wide temperature range for not only a continuous signal but a burst signal with no dependence to an input signal.

It is other object of the present invention to provide an optical signal transmitter employing a semiconductor laser modulating system to obtain a suitable optical output waveform within a wide temperature range from a semiconductor laser in an APC free system.

It is further object of the present invention to provide an optical signal transmitter employing a semiconductor laser modulating system to obtain a suitable optical output waveform within a wide temperature range with no dependence to an input signal in an APC free system.

A basic structure of the present invention to realize the above-described objects of the present invention may have a semiconductor laser diode, a driver circuit, which supplies a bias current and a pulse current corresponding to a size of an input signal to the semiconductor laser, a pulse current controller, which controls a size of the pulse current, a bias current controller, which controls the size of the bias current, and a duty variable circuit, which changes the duty of the input signal. The duty variable circuit sets the duty of the input signal so as that the duty of optical output waveform from the semiconductor laser diode becomes 100% or more at the time of initial adjustment.

Therefore, it becomes possible to reduce distortion of output optical waveform, even if light output delay is generated according to temperature fluctuation.

BRIEF DESCRIPTION OF THE DRAWINGS

FIG. 13 is an explanatory diagram of optical output turn-on delay.

DESCRIPTION OF THE PREFERRED EMBODIMENTS

Figure 1A:
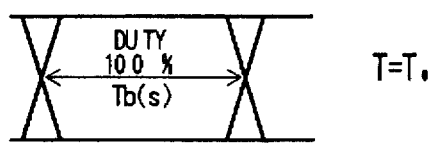
FIGS. 1A and 1B show a principle of the present invention.
Figure 1A:
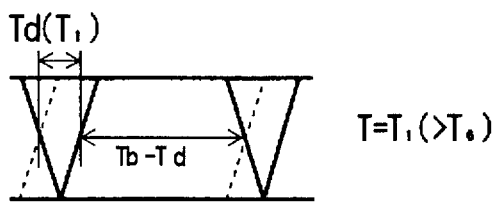

Examples of the present invention will be explained according to the drawings. Throughout the following descriptions, the same reference numerals are used to denote and identify corresponding or identical components.

Figure 1B:
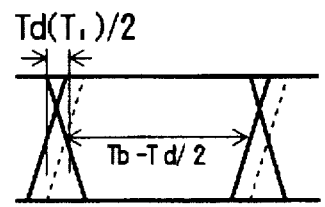
Figure 1B:
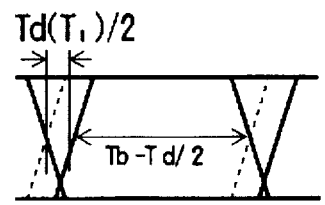

To better understand the present invention, a principle of the present invention will be explained. FIGS. 1A and 1B show a principle of the present invention. More particularly, FIG. 1A show optical waveform in an APC free system in the case where the optical output waveform is $T=T_0$, and the duty is set to 100%.

It is well-known for an ordinary skilled person in the art that the optical output waveform develops a tendency to reduce the duty according to the turn-on delay time, due to temperature fluctuation, as shown in FIG. 13. The turn-on delay time $T_d$ ($T_1$) is marked as a deterioration of an optical output in a phase direction on the highest temperature ($T_1$).

It is apparent from FIG. 1A that the turn-on delay $T_d$ is generated and waveform distortion is generated on a temperature $T=T_1$, higher than the temperature $T=T_0$. More particularly, a failure of bits is generated on high temperature side according to the turn-on delay $T_d$. That causes hindrance in communication.

FIG. 1B shows the case where the duty of an output of the semiconductor laser driver circuit is changed to initially set optical output waveform to more than 100%. As shown in FIG. 1B, for example, an initial phase is set fast by an adjustment Td ($T_1$)/2 on the side of low temperature $T(=T_0)$ to make the duty of the optical output, 100+α %.

Therefore, when the temperature rises ($T=T_1$), it becomes possible that deterioration of an optical output in a phase direction be less than Td ($T_1$)/2.

Figure 2:
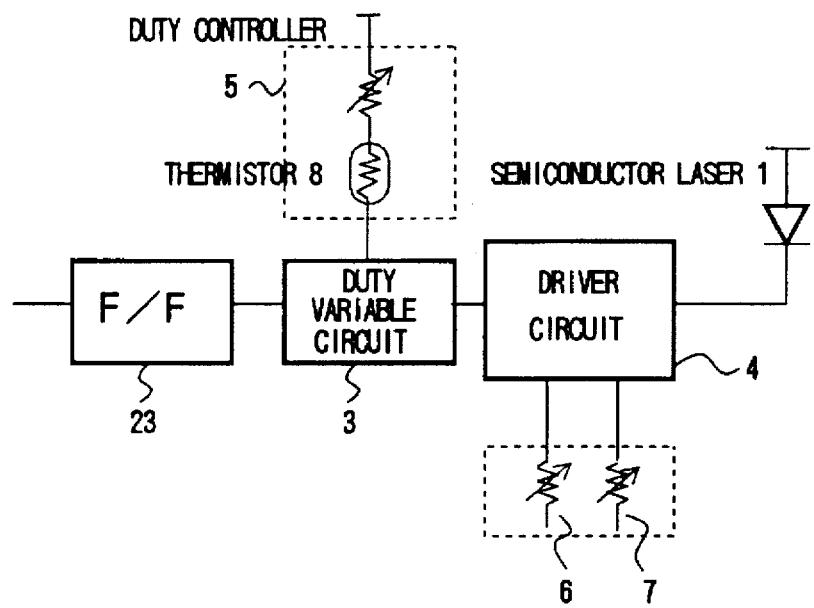
FIG. 2 is an explanatory diagram of a first mode of the present invention.

FIG. 2 is a block diagram for explaining a first example of the present invention. A semiconductor laser 1 is given a bias current and a pulse current corresponding to an input data by the driver circuit 4. Further, a controller 6, which controls the bias current and a controller 7, which controls the pulse current are provided as the driver circuit.

Further, in FIG. 2, a duty variable circuit 3 varies the duty of waveform of an electrical signal inputted corresponding to the set of resistance value in the duty controller 5. Further, reference numeral 23 is a flip flop circuit.

With the structure, in FIG. 2, the F/F circuit 23 forms the waveform of an electrical signal of the input data to be the duty of 100%, at first. Further, the output waveform of the F/F circuit 23 is set to have the duty of more than 100% by the duty variable circuit 3.

In this way, the semiconductor laser diode 1 is driven by the driver circuit 4, according to the data, of which duty is changed and set.

In the structure shown in FIG. 2, it is possible to make the optical output duty not to depend on an input waveform by once forming or shaping the waveform in the F/F circuit. Further, the duty controller 5 includes a temperature-sensitive element 8, such as a thermistor or the like, and supplies a current change due to a temperature rise to the duty variable circuit 3. The duty controller 5 controls the duty variable circuit 3 to compensate the decrease of the optical output waveform duty according to an turn-on delay time due to the temperature rise by increasing the output waveform duty. Therefore, the fluctuation of the optical waveform according to temperature can be reduced.

Figure 3A:
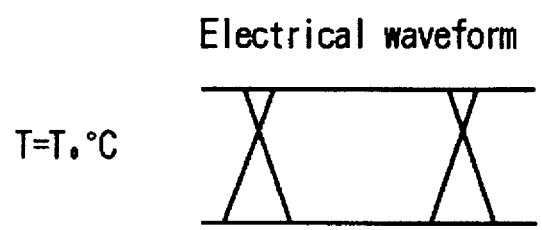
FIGS. 3A and 3B show a waveform diagram for explaining operation shown in FIG. 2.
Figure 3B:
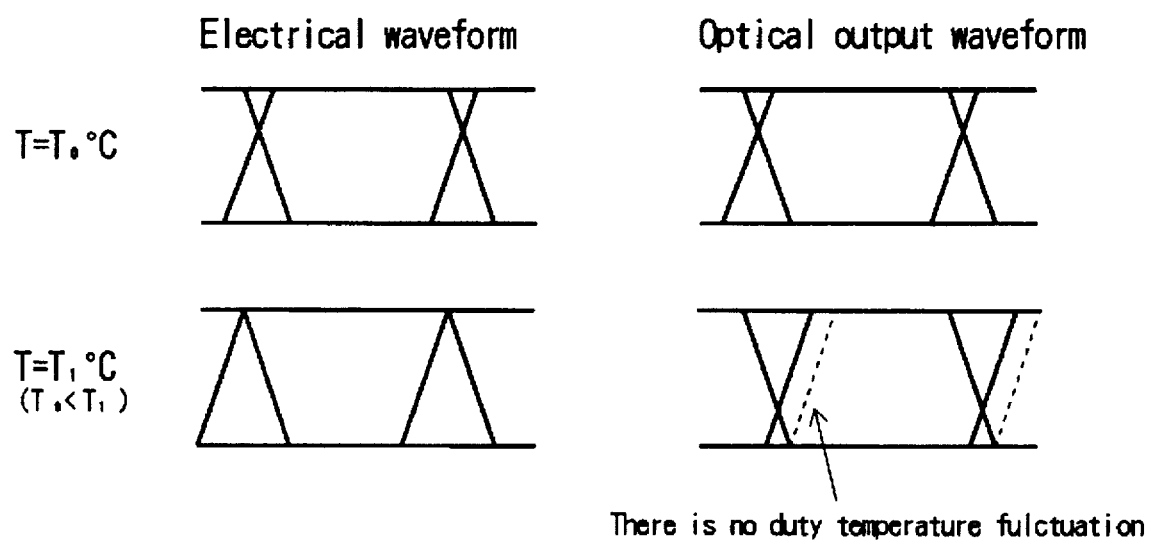

FIGS. 3A and 3B show the above-described mode. In FIGS. 3A and 3B, an electrical waveform $T=T_0$ and $T=T_1$, and optical output waveform at the temperature $T=T_0$ and $T=T_1$ are shown, respectively.

It becomes apparent from FIG. 3A that the duty of the electrical output waveform of the duty variable circuit 3 is controlled to more than 100% according to temperature fluctuation. Therefore, as shown in FIG. 3B, illustrating the diagram of optical output waveform, when the temperature $T=T_1$ (>$T_0$), as compared with the case where there is no compensation of duty temperature as the result of providing the temperature compensating element 8, such as a thermistor, in the duty controller 5 shown with the dotted line, waveform distortion due to the waveform delay can be reduced.

Figure 4A:
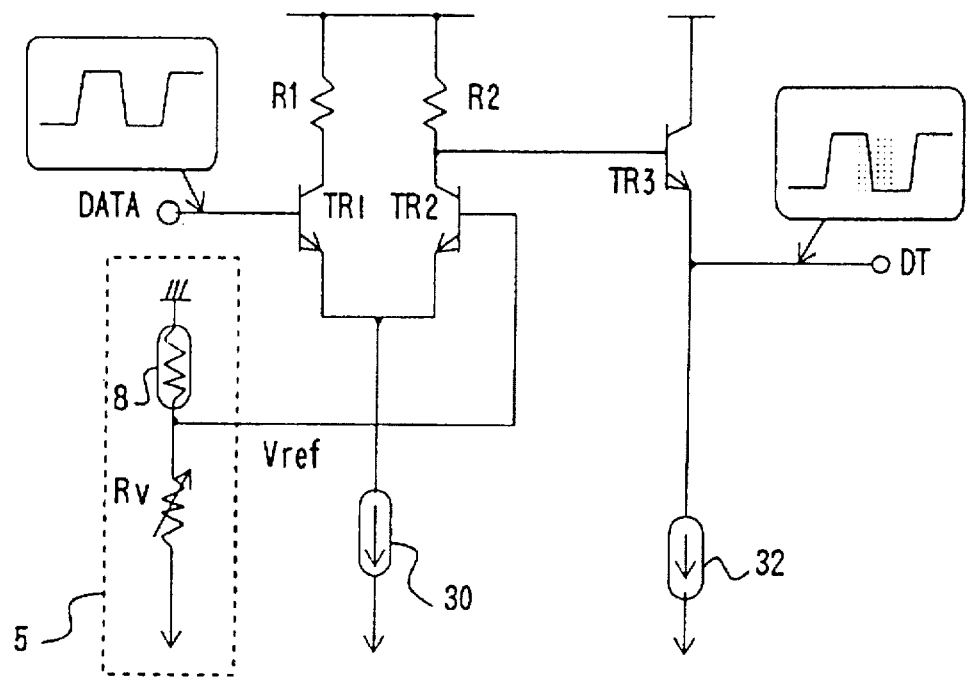
FIGS. 4A and 4B show a structural example of the duty variable circuit and the duty controller shown in FIG. 2.
Figure 4B:
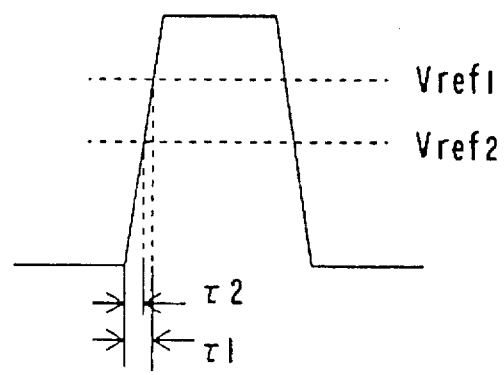
Figure 5:
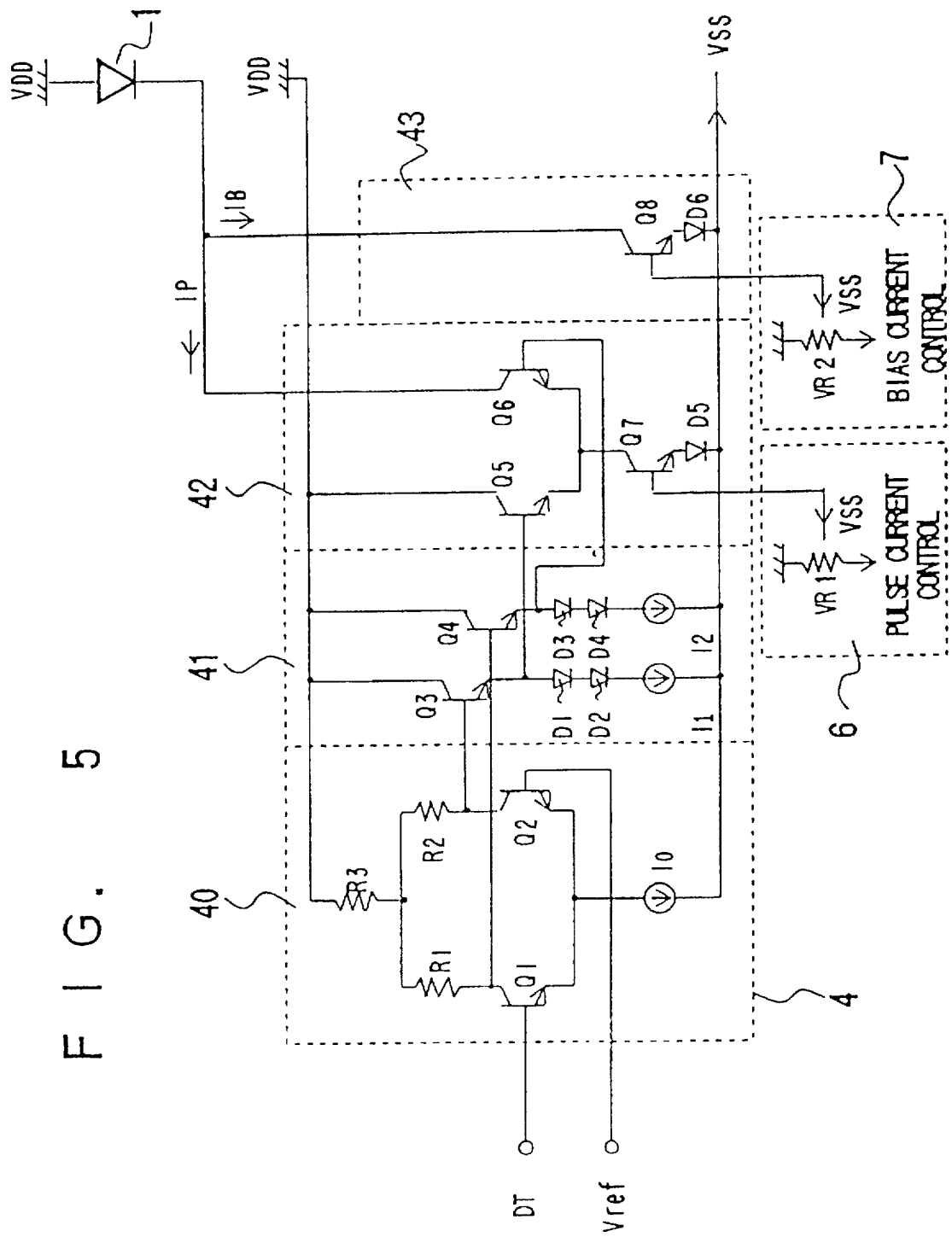
FIG. 5 is a structural example of the driver circuit shown in FIG. 2.

FIGS. 4A and 4B further show a structural example of the duty variable circuit 3 and the duty controller 5 in the structural block diagram shown in FIG. 2. Further, FIG. 5 is a structural example of the driver circuit 4 shown in FIG. 2. As referring to these figures, the operation of the first mode will be further explained.

In FIG. 4, the duty variable circuit 3 comprises a differential pair composed of a pair of transistors $TR_1$ and $TR_2$, of which emitters are commonly connected to a constant current source 30 and collectors are connected to resistances $R_1$ and $R_2$. Data is inputted to a base of the transistor $TR_1$, which is one of the differential pair. A duty controller 5 is connected to a base terminal of the other transistor $TR_2$.

As one example, the duty controller 5 is formed of a serial circuit composed of a temperature-sensitive element 8, such as a thermistor or the like, and a variable resistor $R_v$. A potential of the connecting point between the temperature-sensitive element 8 and the variable resistor $R_v$ is supplied to a base terminal of the transistor $TR_2$. Further, when the temperature $T=T_0$, the variable resistance value is adjusted so that the output of the duty variable circuit 3 has more than 100% duty as an initial value.

Accordingly, the potential of the connecting point between the temperature-sensitive element 8 and the variable resistance $R_v$ becomes a reference potential of the data inputted to the base of the transistor $TR_1$, which is one of the differential pair. The collector of the transistor $TR_2$, which is the other of the differential pair, is further inputted to the base of transistor $TR_3$ having a grounded collector on the next stage. The emitter of the transistor $TR_3$ is connected to a constant current source 32, and outputs the duty-controlled data.

In FIG. 4A, when alternating data signal, of which waveform is shaped in the flip flop FF 23 (see FIG. 2), is inputted to the transistor $TR_1$, and the base potential of the transistor $TR_1$ exceeds a reference voltage supplied from the duty controller 5, the transistor $TR_1$ is switched to ON, and the transistor $TR_2$ is switched to OFF. On the other hand, when the base potential of the transistor $TR_1$ is smaller than the reference voltage supplied from the duty controller 5, the transistor $TR_1$ is switched to OFF, and the transistor $TR_2$ is switched to ON.

Then, a data signal, which is an electrical signal, has a leading time [refer to a waveform shown in FIG. 4B]. Consequently, the size of the reference voltage supplied from the duty controller 5 causes the change of timing for switching the transistors $TR_1$ and $TR_2$. That mean, for example, the reference voltage from the duty controller 5 is $V_{ref1}$, the transistor $TR_1$ is switched to ON with a timing of $\tau 1$. In addition, when the reference voltage is $V_{ref2}$, the transistor $TR_1$ is switched to ON with a timing of $\tau 2$.

By adjusting the variable resistance $R_v$, in the duty controller 5, as shown in FIG. 3, when the temperature is high $(T=T_1)$, it is possible to set the duty to more than 100% on the step of the electrical signal, according to a principle of the present invention shown in FIG. 1, without receiving distortion due to light output delay.

In the circuit shown in FIG. 4A, the duty controller 5, which includes a temperature-sensitive element 8, such as a thermistor, develops a negative resistance value against the temperature fluctuation. Accordingly, the potential of a connecting point of the temperature-sensitive element 8 and the variable resistance $R_v$ is fluctuated according to the temperature. However, the fluctuation gives a direction for removing influence of light output delay according to the temperature. Thereby, as explained later, even if the APC free system is employed, it is possible to give duty, which can solve the above-described problem of light optical delay due to the temperature fluctuation.

In this way, the data signal, of which duty is controlled, is inputted to the driver circuit 4. A structure of the driver circuit 4 shown in FIG. 5 includes an input side differential circuit 40, an emitter-follower circuit 41, and the bias current supplier 43. Further, the pulse current controller 6 and the bias current controller 7 are connected to the driver circuit 4.

The input side differential circuit 40 is composed of a pair of transistors $Q_1$ and $Q_2$, of which level is alternated according to the data of "1" or "0", and to which an input data signal DT and the reference voltage $V_{ref}$ are inputted. The duty of the input data signal and the reference voltage are controlled in the above-described duty variable circuit 3.

The emitter follower circuit 4 includes transistors $Q_3$ and $Q_4$, which adjust the level of a differential output of the input side differential circuit 40. Further, an output side differential circuit 42 is composed of a pair of transistors $Q_5$ and $Q_6$.

The above-described data signal DT is inputted to a base terminal of a first transistor $Q_1$ of the input side differential circuit 40, and a constant reference voltage, i.e. fixed reference voltage $V_{ref}$ is inputted to a base terminal of a second transistor $Q_2$. Further, each of the emitter terminals of the transistors $Q_1$ and $Q_2$ are connected to the negative source voltage $V_{SS}$ through a constant current source $I_O$, and each of the collector terminals is connected to a current voltage $V_{DD}$, i.e., a ground, through resistors $R_1$, $R_2$, and $R_3$.

When the input data signal DT is larger than the reference voltage $V_{ref}$, the transistor $Q_1$ is switched to ON, and the transistor $Q_2$ is switched to OFF. Further, the input data signal is smaller than the reference voltage $V_{ref}$, the transistor $Q_1$ is switched to OFF, and the transistor $Q_2$ is switched to ON.

Several of diodes D1 to D4 are inserted to emitter terminals of each of the transistors $Q_3$ and $Q_4$, which form an emitter follower circuit 41, in order to adjust the level. Each collector of the transistors $Q_1$ and $Q_2$ in the input side differential circuit 40 is connected to each of the base terminals of the transistors $Q_3$ and $Q_4$.

Additionally, each of the collector terminals of the transistors $Q_3$ and $Q_4$ is connected to the source voltage $V_{DD}$ (ground), and each of the emitter terminals are connected to the negative source voltage $V_{SS}$ through diodes for controlling the level and constant sources $I_1$ and $I_2$.

The collector terminal of the first transistor $Q_5$ of the output side differential circuit 42 is connected to the source voltage $V_{DD}$ (ground), and the collector terminal of the second transistor $Q_6$ is connected to a semiconductor laser diode 1. Each of the base terminals of the transistors $Q_5$ and $Q_6$ is connected to each of the emitter terminals of the transistors $Q_3$ and $Q_4$ in the emitter follower circuit 41. Further, the emitter terminals of the transistors $Q_5$ and $Q_6$ are connected to the source voltage $V_{SS}$ through the third transistor $Q_7$ and the diode D5.

Further, the base terminal of the third transistor $Q_7$ is connected to the pulse current controller 6 to control the bias current $I_B$ according to a voltage $V_{gs}$ between the base and the emitter. The pulse current controller 6 including a variable resistance VR1 connected between the ground and the source voltage $V_{SS}$ controls the pulse current $I_P$ by adjusting a voltage between the base and the emitter of the transistor $Q_7$.

The driver circuit 4 further includes a bias current supplier 43. The bias current supplier 43 provides a transistor $Q_8$ and a diode D6. A collector terminal of the transistor $Q_8$ is connected to the semiconductor laser diode 1. The base terminal of the transistor $Q_8$ is connected to the bias current controller 7 to control the bias current $I_B$ with the voltage $V_{gs}$ between the base and the emitter.

The pulse current controller 6 provides a variable resistor VR1 connected between a ground and a source voltage $V_{SS}$ to control the pulse current $I_P$ by adjusting a voltage between the base and the emitter of the transistor $Q_7$ in the pulse current supplier 42. The bias current controller 7 provides a ground and a variable resistor VR2 connected between the ground and the source voltage $V_{SS}$ to control the bias current $I_B$ by adjusting a voltage between the base and the emitter of the transistor $Q_8$ in a bias current supplier 43.

When the level of the data signal DT, which is an output of the duty variable circuit 3, is larger than the reference voltage $V_{ref}$ (data="1"), the transistor $Q_1$ in the differential circuit 40 is switched to ON, and the transistor $Q_2$ is switched to OFF. As the result, the transistor $Q_5$ in the output side differential circuit 42 is switched to ON, and the transistor $Q_6$ is switched to OFF, thus the pulse current $I_P$ could not flow to the semiconductor laser diode 1, and the light cannot be outputted.

Meanwhile, when the level of the data signal DT is smaller than the reference voltage $V_{ref}$ (data="0"), the transistor $Q_1$ in the differential circuit 40 is switched to OFF, and the transistor $Q_2$ is switched to ON. In this respect, the transistor $Q_5$ in the output side differential circuit 42 is switched to OFF, and the transistor $Q_6$ is switched to ON, thus the pulse current $I_P$ is flowed to the semiconductor laser diode 1 and, then the light is outputted. In this case, the desired optical output $P_0$ can be obtained by adjusting variable resistor VR1 in the pulse current controller 6 and a variable resistor VR2 in the bias current controller 7.

Figure 6:
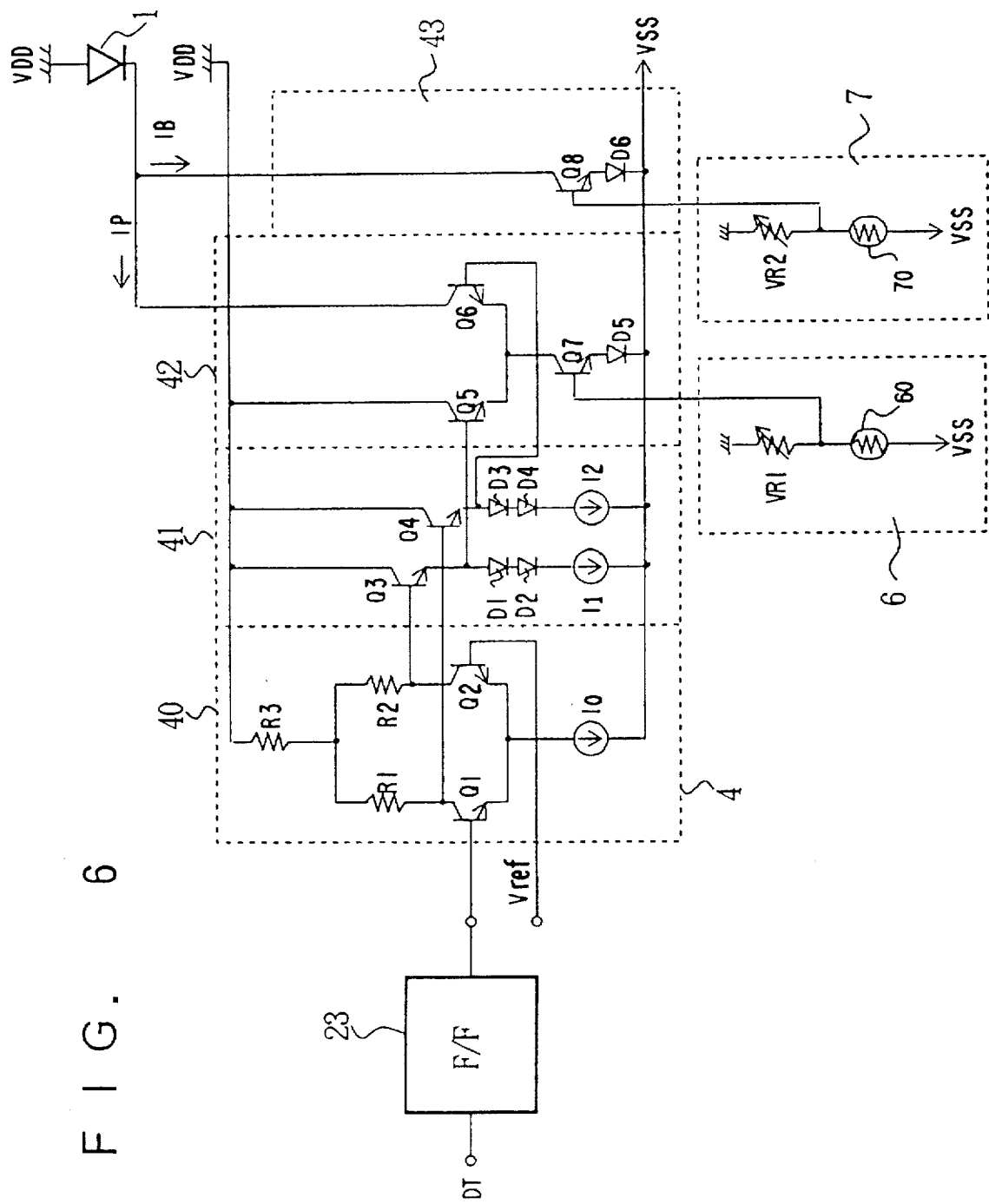
FIG. 6 is an explanatory diagram of a second mode of the present invention.

FIG. 6 is a block diagram for explaining the second example of the present invention. In the second example, as compared with the first example shown in FIG. 2, the duty variable circuit 3 and the duty controller 5 are omitted. Further, it is different from the structure of the driver circuit 4 shown in FIG. 2 to allocate FETs $Q_1$ to $Q_8$, instead of the transistors $Q_1$ to $Q_8$.

Temperature-sensitive elements 60 and 70, such as a thermistor, are respectively inserted to each of the pulse current controller 6 and the bias current controller 7, serially with the variable resistors VR1 and VR2. It is also possible to have only one of the temperature-sensitive elements 60 and 70, according to the mode of the later-explained embodiment.

As similar with FIG. 2, an input signal is made to the duty of 100%, and the pulse current and the bias current are set to current values for each temperature according to the principle explained with respect to FIGS. 1 and 3, respectively, by the pulse current control circuit 6, which is composed of thermistor 60 and variable resistor VR1 and bias current control circuit 7, which is composed of thermistor 70 and variable resistor VR2. With this structure, it is possible to individually control each of the pulse current and the bias current according to the temperature fluctuation.

Figure 7:
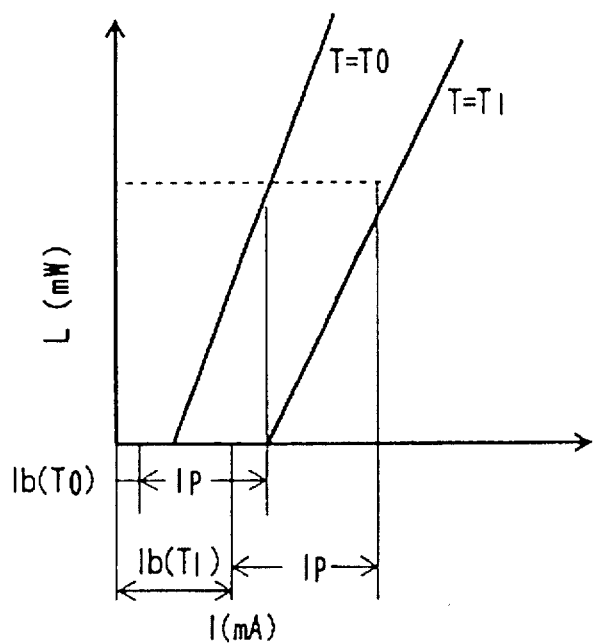
FIG. 7 is an explanatory diagram of a first embodiment on the mode shown in FIG. 6.

FIG. 7 shows a first control example based on a feature of making it possible to respectively control to each of the pulse current and bias current. In this control example, it is controlled so as to fix the pulse current and change only the size of the bias current according to the temperature. In FIG. 6, a thermistor 70 in the bias current controller 7 is omitted. Accordingly, when the temperature varies from $T_0$ to $T_1$, the bias current $I_b$ is increased. On the other hand, the pulse current $I_P$ is set to a predetermined value according to the existence of the temperature-sensitive element 70.

In this way, the bias current $I_b$ is controlled to vary according to I-L characteristic of the semiconductor laser 1 and the characteristic of a threshold current Ith of the semiconductor laser diode 1, according to the temperature. As stabilization of optical output may be performed not by optical output data but by the temperature, the stable optical output can be obtained without dependence to the input signal and photo diode for monitoring.

Accordingly, the optical output of the bias current $I_b$ becomes constant on each temperature according to the I-L characteristic of the semiconductor laser diode 1, and it is set as $I_b \leq$ Ith. Consequently, even if the I-L characteristic of the semiconductor laser diode 1 is changed due to the rise of the time of rising the temperature, it becomes apparent from the above-described equation (1) that the optical output is approximately constant, and the turn-on delay time $T_d$ becomes smaller than the fixed bias current $I_b$, as the bias current $I_b$ becomes larger according to the rise of temperature.

Figure 8:
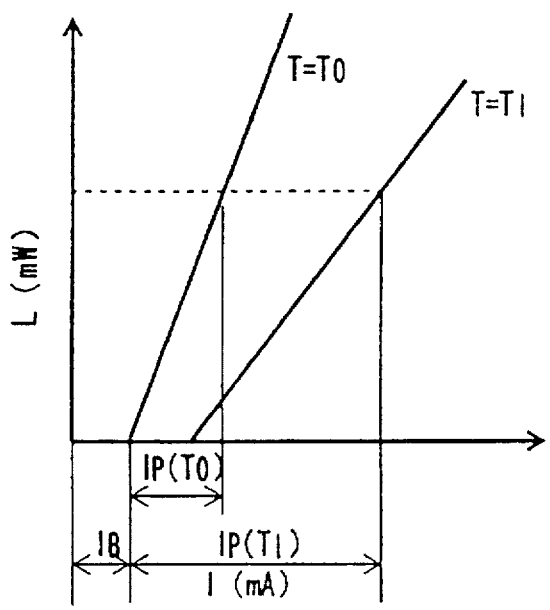
FIG. 8 is an explanatory diagram of a second embodiment on the mode shown in FIG. 6.

FIG. 8 shows a second control example based on a feature of making it possible to respectively control to each of the pulse current and the bias current. In this control example, the bias current is fixed, i.e., it is controlled so that only the size of the pulse current is changed according to the temperature.

In FIG. 6, a thermistor 70 in the pulse current controller 7 is omitted. Accordingly, compensation is not performed with respect to the increase of the pulse current due to the rise of the temperature. Therefore, when the temperature varies from $T_0$ to $T_1$, the pulse current $I_P$ is increased. On the other hand, the bias current $I_b$ is set to a predetermined value according to the existence of the temperature-sensitive element 60.

In this way, the pulse current $I_P$ is changed based on the I-L characteristic of the semiconductor laser diode 1 and the characteristic of a threshold current Ith of the semiconductor laser 1, according to the temperature. As stabilization of an optical output is performed not only by optical output data but by the temperature, the stable optical output can be obtained, without dependence to the input signal, even to a burst signal.

Accordingly, the pulse current $I_P$ is set so that an optical output becomes constant and the relation is set as $I_P \leq$ Ith, according to the I-L characteristic of the semiconductor laser diode 1. Consequently, the oscillation delay time $T_d$ becomes smaller than the fixed bias current $I_P$, because the optical output becomes approximately constant and $I_P$ becomes large due to the rise of temperature, according to the already explained equation (1), even where the I-L characteristic of the semiconductor laser diode 1 is changed due to the rise of the temperature.

Figure 9:
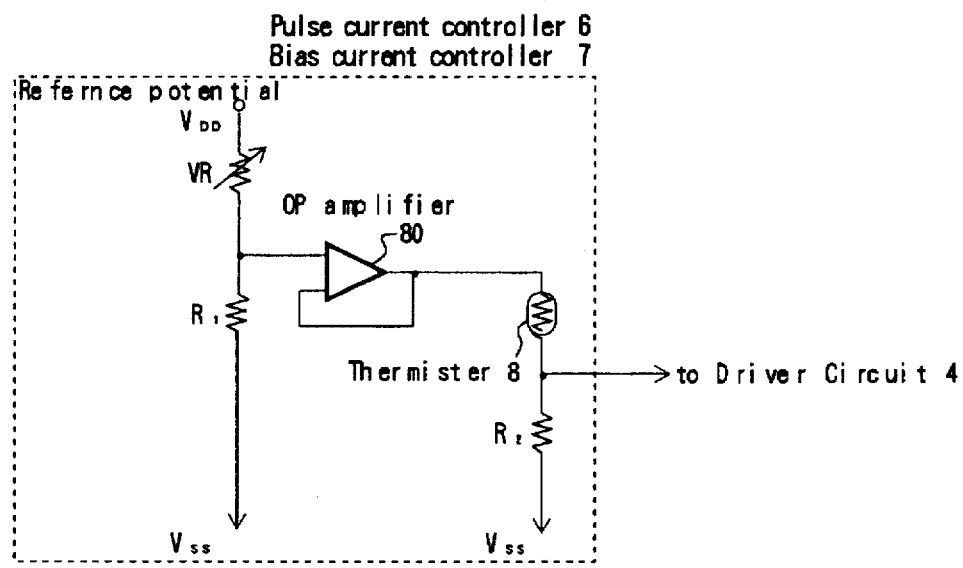
FIG. 9 is an explanatory diagram of a third mode of the present invention.

FIG. 9 shows a block diagram showing a third example of the present invention, which shows other structural example of the pulse current controller 6 and the bias current controller 7 shown in FIG. 6. In the structural example, each of the pulse current controller 6 and the bias current controller 7 is composed of a current absolute value controller, which decides an absolute value of each control voltage, and a temperature characteristic controller, which decides temperature characteristic, according to the characteristic of the thermistor, to make it easy to adjust the current value.

That is, the current absolute value controller, which decides the absolute value of the control voltage, is composed of a serial circuit of a variable resistor VR and a resistor $R_1$ inserted between reference voltages, and a temperature characteristic controller for deciding temperature characteristic is composed of a serial circuit of a thermistor 8 and a resistance $R_2$. Then, the current absolute value controller and the temperature characteristic controller are separated by the arithmetic amplifier 80.

Figure 10:
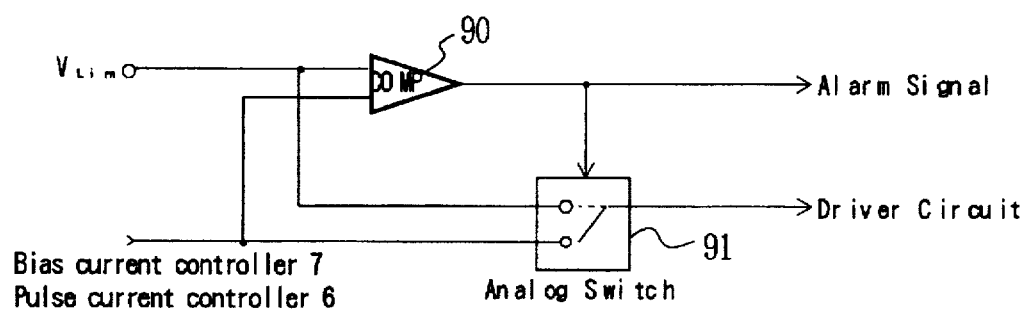
FIG. 10 is an explanatory diagram of a fourth mode of the present invention.

FIG. 10 shows a fourth embodiment of the present invention. The pulse current and the bias current are controlled for the semiconductor laser 1 according to the outputs of the pulse current controller 6 and the bias current controller 7. Then, when the pulse current and the bias current are large, as thermal-runaway is generated on the current of the semiconductor laser diode 1, the semiconductor laser diode 1 may be destroyed.

That is, FIG. 10 shows an embodiment for solving such the problem. The structure shown in FIG. 10 includes a comparator 90 and an analog switch 91. A limit voltage $V_{Lim}$ and the output of the pulse current controller 6 or the bias current controller 7 are inputted to the comparator 90. Simultaneously, these inputs are inputted to the analog switch 91.

When the comparator 90 detects that the output of the pulse current controller 6 or the bias current controller 7 exceeds to the limit voltage $V_{Lim}$, an alarm signal is outputted. The alarm signal notifies a possibility of thermal runaway of the semiconductor laser diode 1 to operators. Simultaneously, the analog switch 91 is switched, and the output of the pulse current controller 6 or the bias current controller 7 is stopped, and the limit voltage $V_{Lim}$ is outputted.

The limit voltage $V_{Lim}$ is sent to the driver circuit 4, and the pulse current and the bias current corresponding to the limit voltage $V_{Lim}$ are limited, so that the thermal runaway of the semiconductor laser diode 1 can be prevented.

Figure 11:
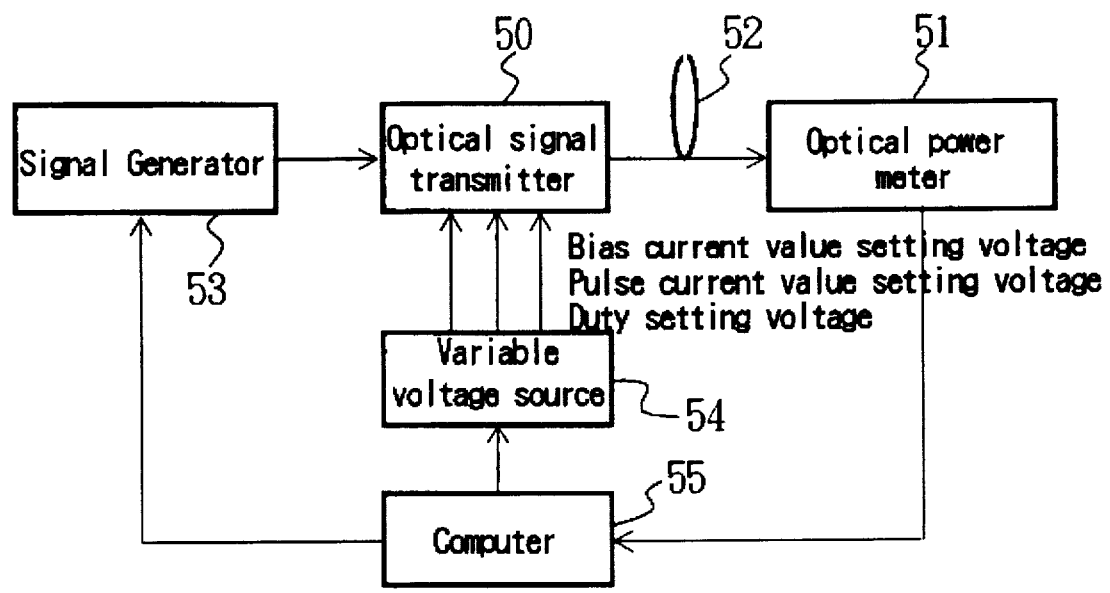
FIG. 11 is an explanatory diagram of a fifth mode of the present invention.
Figure 12:
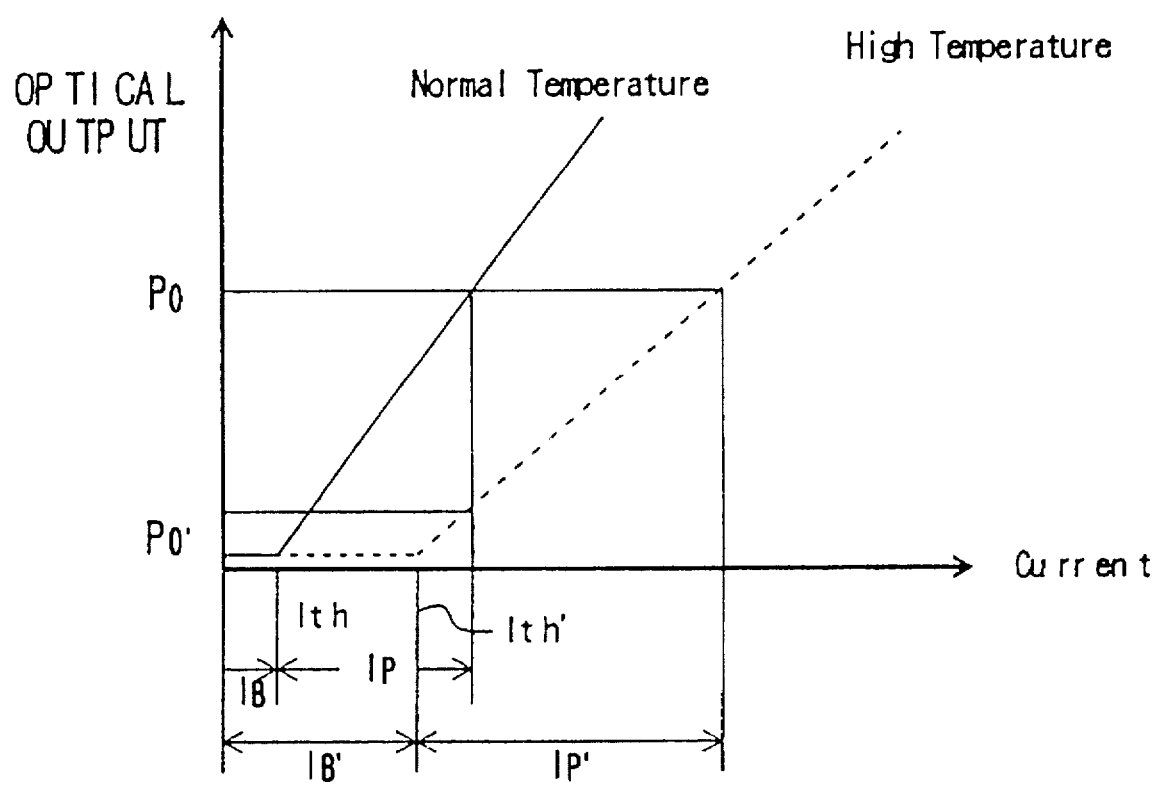
FIG. 12 shows an explanatory diagram of a temperature characteristic of an optical power and a driving current.

FIG. 11 shows a fifth embodiment of the present invention, which shows a structure of adjusting equipment for an optical signal transmitter according to the present invention, employing an APC free modulating system. In FIG. 11, reference numeral 50 is an optical signal transmitter according to the present invention. An optical power meter 51 monitors an optical output power outputted from the optical signal transmitter 50 through an optical fiber 52. A signal generator 53 generates an input signal, and a variable voltage source 54 sets initial values of a current value setting voltage, a pulse current value setting voltage and the duty.

Further, a computer 55 controls the output signal of the signal generator 53 and controls a variable current source 54 with monitoring the signal outputted from the power meter 51. The bias current, the pulse current, and the duty in the optical signal transmitter 50 are automatically set initially.

In this embodiment, the voltage value of the variable voltage source 54 is adjusted so that the value of the optical power meter 51, when changing a mark ratio of the output of the above-described signal generator 53 to 0, ½, 1, becomes a desired value.

Further, it is possible to obtain a compact device by making circuitry parts of the optical signal transmitter according to the present invention into a monolithic IC. Then, it is also possible to make it more compact by employing Band Gap Reference (BGR) as a reference voltage source when making the circuitry parts to a monolithic IC.

Alternatively, a timer provided in a CPU is employed on the device. A used time of the optical signal transmitter according to the present invention can be detected by the timer. Accordingly, it becomes possible to control the bias current, the pulse current, and the duty according to the used time.

As explained according to the above-described embodiments of the present invention, a suitable optical output characteristic within a wide temperature range in an optical signal transmitter may be obtained, and more particularly, an APC free system, which is a semiconductor laser modulating system effective to optical parallel transmission may be obtained. Accordingly, it becomes possible to construct a system, which can use an optical signal transmitter using the semiconductor laser diode effectively, in order to send and receive data transmission of the computer as an optical signal.

The present invention may be embodied in other specific forms without departing from the spirit or essential characteristic thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An optical signal transmitter comprising:
   a semiconductor laser diode;
   a driver circuit operatively connected to the semiconductor laser diode for supplying a bias current and a pulse current corresponding to the level of an input signal to the semiconductor laser diode;
   a bias current controller operatively connected to the driver circuit for controlling the level of the bias current;
   a pulse current controller operatively connected to the driver circuit for controlling the level of the pulse current; and
   a duty variable circuit operatively connected to the driver circuit for setting the duty of the input signal to make the duty of an optical output from the semiconductor laser diode more than 100% at an initial adjustment.

2. The optical signal transmitter according to claim 1; further comprising a flip-flop circuit connected to the duty variable circuit to receive the input signal and form more than 100% duty of the input signal before supplying the input signal to the duty variable circuit.

3. The optical signal transmitter according to claim 2; further comprising a duty control circuit including a temperature sensitive element for varying the duty of an output from the duty variable circuit according to temperature.

4. The optical signal transmitter according to claim 3 wherein the temperature sensitive element is located near the semiconductor laser diode.

5. The optical signal transmitter according to claim 4; further comprising a limiter circuit operatively connected to the pulse current control circuit for monitoring an output of the temperature sensitive element and limiting an output of the pulse current control circuit not to exceed a predetermined value according to an output of the monitoring circuit.

6. The optical signal transmitter according to claim 5; wherein the limiter circuit outputs an alarm signal when the limiter circuit limits the output of the pulse current control circuit.

7. The optical signal transmitter according to claim 4; further comprising a limiter circuit operatively connected to the bias current control circuit for monitoring an output of the temperature sensitive element and limiting an output of the bias current control circuit not to exceed a predetermined value according to an output of the monitoring circuit.

8. The optical signal transmitter according to claim 7; wherein the limiter circuit outputs a alarm signal when the limiter circuit limits the output of the bias current control circuit.

9. The optical signal transmitter according to claim 1, wherein the value of the bias current is set to 0, and only the pulse current is supplied to the semiconductor laser diode.

10. An optical signal transmitter comprising:
    a semiconductor laser diode;
    a driver circuit operatively connected to the semiconductor laser diode for supplying a bias current and a pulse current corresponding to the level of an input signal to the semiconductor laser diode;
    a waveform forming circuit provided at an input side and supplied with the input signal for forming the input signal to have 100% duty;
    a bias current controller operatively connected to the driver circuit for controlling the level of the bias current; and
    a pulse current controller operatively connected to the driver circuit including a temperature sensitive element and for controlling the level of the pulse current in a direction opposite to a temperature fluctuation in an optical output of the semiconductor laser diode.

11. The optical signal transmitter according to claim 10 wherein the pulse current controller includes a temperature characteristic controller and a current absolute vale controller.

12. The optical signal transmitter according to claim 11;

wherein a reference voltage source is employed as the pulse current controller.

13. The optical signal transmitter according to claim 12 wherein a band gap reference is employed as the reference voltage source.

14. The optical signal transmitter according to claim 11; wherein a reference voltage source is employed as the bias current controller.

15. An optical signal transmitter comprising:

a semiconductor laser diode;

a driver circuit operatively connected to the semiconductor laser diode for supplying a bias current and a pulse current corresponding to the level of an input signal to the semiconductor laser diode;

a waveform forming circuit provided at an input side and supplied with the input signal for forming the input signal to have 100% duty;

a bias current controller operatively connected to the driver circuit including a temperature sensitive element and for controlling the level of the bias current in a direction opposite to a temperature fluctuation in an optical output of the semiconductor laser diode; and a pulse current controller operatively connected to the driver circuit for controlling the level of the pulse current.

16. An optical signal transmitter comprising:

a semiconductor laser diode;

a driver circuit operatively connected to the semiconductor laser diode for supplying a bias current and a pulse current corresponding to the level of an input signal to the semiconductor laser diode;

a waveform forming circuit provided at an input side and supplied with the input signal for forming the input signal to have 100% duty;

a bias current controller operatively connected to the driver circuit including a temperature sensitive element and for controlling the level of the bias current in a direction opposite to a temperature fluctuation in an optical output of the semiconductor laser diode; and a pulse current controller operatively connected to the driver circuit including a temperature sensitive element and for controlling the level of the pulse current in a direction opposite to a temperature fluctuation in an optical output of the semiconductor laser diode operatively connected to the driver circuit for controlling the level of the pulse current.

17. The optical signal transmitter according to claim 16; wherein the pulse current, the bias current, or the both currents selected from currents flowing to the semiconductor laser diode is adjusted according to the temperature.

18. An initial value adjustment device for use in an optical signal transmitter including a semiconductor laser diode, a driver circuit operatively connected to the semiconductor laser diode for supplying a bias current and a pulse current corresponding to the level of an input signal to the semiconductor laser diode, a bias current controller operatively connected to the driver circuit for controlling the level of the bias current, a pulse current controller operatively connected to the driver circuit for controlling the level of the pulse current, and a duty variable circuit operatively connected to the driver circuit for setting the duty of the the input signal to make the duty of an optical output from the semiconductor laser diode more than 100% at an initial adjustment, the initial value adjustment circuit comprising:

a signal generator for generating the optical input signal;

a optical power meter for monitoring an optical output of the optical signal transmitter;

a variable voltage source for setting initial values of the bias current, the pulse current and the duty of the optical output; and a CPU for monitoring an output of the optical power meter and controlling the value of the output of the signal generator and the variable voltage source to set the initial values by adjusting the voltage of the variable voltage source so that the value of the optical power meter becomes a desired value when the output signal of the signal generator are changed to a plurality of mark ratios.

19. An initial value adjustment device according to claim 18;

wherein the optical signal transmitter includes a temperature sensitive element and the CPU monitors an output of the temperature sensitive element to control the pulse current, the bias current and the duty.

20. An initial value adjustment device according to claim 18;

wherein the CPU includes a timer, and detects a time period during which the optical signal transmitter has been used by the timer and controls the pulse current, the bias current and the duty according to the detected time period.

* * * * *